United States Patent [19]

Loper et al.

[11] Patent Number: 5,607,601
[45] Date of Patent: Mar. 4, 1997

[54] METHOD FOR PATTERNING AND ETCHING FILM LAYERS OF SEMICONDUCTOR DEVICES

[75] Inventors: Gary L. Loper, Huntington Beach, Calif.; Martin D. Tabat, Nashua, N.H.

[73] Assignee: The Aerospace Corporation, El Segundo, Calif.

[21] Appl. No.: 382,563

[22] Filed: Feb. 2, 1995

[51] Int. Cl.$^6$ .......................... C03C 15/00; C03C 25/06; C23F 1/00; B44C 1/22
[52] U.S. Cl. .............................. 216/63; 216/65; 156/643.1
[58] Field of Search ..................... 156/643.1; 216/63, 216/65

[56] References Cited

U.S. PATENT DOCUMENTS

| | | | |
|---|---|---|---|
| 4,260,649 | 4/1981 | Denison et al. | 216/65 |
| 4,331,504 | 5/1982 | Chuang et al. | 156/635 |
| 4,490,210 | 12/1984 | Chen et al. | 156/643 |
| 4,490,211 | 12/1984 | Chen et al. | 156/643 |
| 4,731,158 | 3/1988 | Brannon | 156/643 |
| 4,892,592 | 1/1990 | Dickson et al. | 136/244 |
| 5,010,040 | 4/1991 | Vayman | 437/230 |
| 5,011,567 | 4/1991 | Gonsiorawski | 156/643 |
| 5,024,724 | 6/1991 | Hirono et al. | 156/643 |
| 5,266,532 | 11/1993 | Russell et al. | 437/242 |
| 5,310,989 | 5/1994 | Russell et al. | 219/121.68 |
| 5,354,420 | 10/1994 | Russell et al. | 156/643 |

OTHER PUBLICATIONS

W. Sesselmann, E. E. Marienero, T. J. Chuang "Laser-Induced Desorption and Etching Processes on Chlorinated Cu and Solid CuCl Surfaces", Applied Physics A. 209–221, 1986.

J. H. Brannon, K. W. Brannon, "Ultraviolet Photoetching of Copper" J. Vac. Sci. Technol. B 7, 1275 – 1283, (1989).

*Primary Examiner*—Richard L. Schilling
*Attorney, Agent, or Firm*—Derrick Michael Reid; William J. Burke

[57] ABSTRACT

In a laser assisted semiconductor etching process, a krypton fluoride excimer laser operating at 248 nm excites a carbonyl dichloride $COCl_2$ radical precursor gas which decomposes into carbon monoxide and also atomic chlorine that bonds to laser illuminated surface layer materials of semiconductor devices to create gaseous chlorides which desorb to perfect selective etching, the surface layer material being Cu, Al, amphorous silicon, $Ga_{(x)}Al_{(1-x)}As$, $CuIn_{(x)}Ga_{(1-x)}Se_2$, CdZnS, ZnO and other materials useful in the manufacture of semiconductor devices and solar cells.

17 Claims, 3 Drawing Sheets

Selective Laser Radical Etching

Selective Laser Radical Etching

METHOD FOR PATTERNING AND ETCHING FILM LAYERS OF SEMICONDUCTOR DEVICES

STATEMENT OF GOVERNMENT INTEREST

This invention was made with Government support under contract F04701-88-C-0089 awarded by the United States Air Force. The Government has certain rights to the invention.

FIELD OF THE INVENTION

This invention relates generally to photon beam assisted etching processes which are particular useful during the manufacture of semiconductor or solar cell devices.

BACKGROUND OF THE INVENTION

Solar cells are presently fabricated commercially by photolithographic processes. These processes often are complex and time consuming. The use of these processes has lead to high cell manufacturing costs which has limited the use of solar cells for terrestrial and space power applications.

During solar cell manufacture, solar cell device structures are built up by successively depositing and then patterning and selectively etching various combinations of metal, semiconductor, and insulator film layers on a suitable substrate. Solar cells typically employ many such film layers. Currently, conventional photolithographic processing methods are employed to pattern and etch the different film layer combinations during the manufacture of solar cells of all types.

During the patterning and etching of a single film layer combination, several steps are required to pattern and develop the photoresist used to mask the topmost film layer for subsequent etching in desired regions. Several other acid, reactive solution, or plasma etching steps are required to selectively remove this film layer from an underlying layer in unmasked regions.

For example, time consuming and costly steps in the fabrication of copper indium diselenide ($CuInSe_2$), copper indium gallium diselenide ($CuIn_{(1-x)}Ga_{(x)}Se_2$, where x can vary between 0 and 1) and amorphous silicon (a-Si) solar cells currently include the photolithographic processes that are separately used to pattern and selectively remove semiconductor film layers used in the cells from underlying metal electrode layers, and to pattern and selectively remove the metal electrode layers from underlying glass, polymeric, or other supporting substrates. For $CuInSe_2$ and $CuIn_{(1-x)}Ga_{(x)}Se_2$ solar cells, this most often involves the removal of combination semiconductor layers of $CdZnS/CuInSe_2$ and $ZnO/CdZnS/CuIn_{(1-x)}Ga_{(x)}Se_2$, respectively, from molybdenum (Mo) electrode layers and these Mo layers from glass. For a-Si cells, this often involves removal of an a-Si layer from a metal electrode layer [typically copper (Cu), aluminum (Al), molybdenum (Mo), or titanium (Ti)] and this metal layer from glass.

Complex photolithographic processing steps currently are also employed to produce etch mesas around the perimeters of gallium arsenide (GaAs) and gallium aluminum arsenide ($Ga_{(1-x)}Al_{(x)}As$, where x can vary between 0 and 1) solar cells during their manufacture as a means of reducing cell leakage currents. In addition, GaAs or $Ga_{(1-x)}Al_{(x)}As$ solar cells used in space applications are generally shielded by a protective coverglass to minimize proton-induced damage that can degrade cell performance. Because cells are electrically connected to each other at their busbars, it is often cumbersome to extend a protective coverglass of the cell beyond the busbar region. The removal of all junction material in the region along the edge of the cell adjacent to, and outside of the busbar of a cell would eliminate the necessity to shield the cell in this region. Thus, methods capable of reliably producing etch mesas in order to remove junction material in this region are desired. The photolithographic processes available for producing these etch mesas in the GaAs and $Ga_{(1-x)}Al_{(x)}As$ semiconductor layers for minimizing cell leakage currents and for minimizing cell radiation damage are sufficiently expensive that they can only be used in the fabrication of custom cells.

The fabrication of multiple layer solar cells requires the use of a number of processing steps. Many different production stations may be required to carry out these photoresist patterning and film layer selective etching steps. The need for these steps and associated production stations limits the production throughput of solar cells and adds to their fabrication costs. One method of patterning and removing a surface layer on a semiconductor substrate is the laser dry etching method wherein a laser excites a gaseous radical precursor compound to decompose it into at least a radical species which combines with and acts to volatilize constituent elements of the surface layer. For example, a krypton fluoride laser operating at 248 nm can excite gaseous carbon tetrachloride ($CCl_4$) by photon absorption to create atomic chlorine which reacts with a copper surface forming cupric chloride and cuprous chloride which are desorbed from the surface by the incident laser light. This method has been disadvantageously only applied to a single constituent metal and is prone to create carbon containing deposits on the surface which limits the efficiency of the dry etching process. This method has limited use during the manufacture of the solar cells which contain complex surface layers, such as $CuInSe_2$, $CuIn_{(x)}Ga_{(1-x)}Se_2$, CdZnS, ZnO, GaAs, and $Ga_{(x)}Al_{(1-x)}As$. These and other disadvantages are solved or reduced using the present invention.

SUMMARY OF THE INVENTION

An object of the present invention is to apply photon beam assisted etching techniques to lower the cost and increase the throughput of fabrication processes.

Another object of the present invention is to apply photon beam assisted etching techniques to lower the cost and increase the throughput of fabrication processes for solar cells.

Yet another object of the present invention is the use of laser assisted etching processes for patterning and selectively removing $CuInSe_2$ and $CuIn_{(1-x)}Ga_{(x)}Se_2$ and other compound semiconductor layers from molybdenum or other electrode materials.

Yet another object of the present invention is the use of laser assisted etching processes for patterning and selectively removing metals, such as copper or aluminum, from underlying film layers by reaction with atomic chlorine.

A further object of the present invention is the use of a single laser assisted etching process for removing combination semiconductor compound layers, such as, $CdZnS/CuInSe_2$ or $ZnO/CdZnS/CuInSe_2$ layers from molybdenum, or other metallic or nonmetallic electrode materials, as well as for removing the combination semiconductor compound layers $CdZnS/CuIn_{(1-x)}Ga_{(x)}Se_2$ or $ZnO/CdZnS/CuIn_{(1-x)}Ga_{(x)}Se_2$ layers from molybdenum or other electrode materials.

Yet a further object of the present invention is the use of laser assisted etching processes for patterning and selectively removing an amorphous silicon (a-Si) semiconductor layer from a metal layer, such as molybdenum, or titanium.

Still a further object of the present invention is the use of laser assisted processes for etching the GaAs and $Ga_{(1-x)}Al_{(x)}As$ semiconductor layers during the production of etch mesas at the edges of GaAs and $Ga_{(1-x)}Al_{(x)}As$ devices.

The present invention provides a maskless and resistless, photon beam assisted, dry etching technique that is suitable for the direct, single step patterning and etching of film layers having constituent elements that react with atomic chlorine, especially those film layers used in solar cells.

A krypton fluoride laser beam assisted etching technique is carried out by placing the part containing the film layer to be patterned and selectively etched in the presence of a carbonyl dichloride ($COCl_2$) radical precursor compound. The topmost film layer of the part is then exposed to a photon beam. Radical chlorine etchant species, each having an unpaired electron, are produced on or near the surface of the film layer to be etched as the result of the photon beam inducing the decomposition of the radical precursor compound. The radical species produced induce etching of the film layer in the regions exposed to the photons from the laser source. The photons striking the surface can facilitate removal of material from the surface by photon assisted ejection. Compounds containing the surface elements may form that are either volatile at the surface temperatures produced during the beam-induced processing, or are desorbed by photostimulated processes at the photon fluences and energies employed. The topmost film layer of a part can be efficiently and selectively removed with respect to its underlying layer of a different material by production of the proper radical species.

The laser assisted etching processes of the present invention will replace the time consuming, yield reducing, and expensive photolithographic processes currently used in the fabrication of solar cells. These laser etching processes will significantly lower the fabrication costs of various types of solar cells. These and other advantages will become more apparent from the following detailed description of the preferred embodiment.

DETAILED DESCRIPTION OF THE PREFERRED EMBODIMENT

Figure 1:
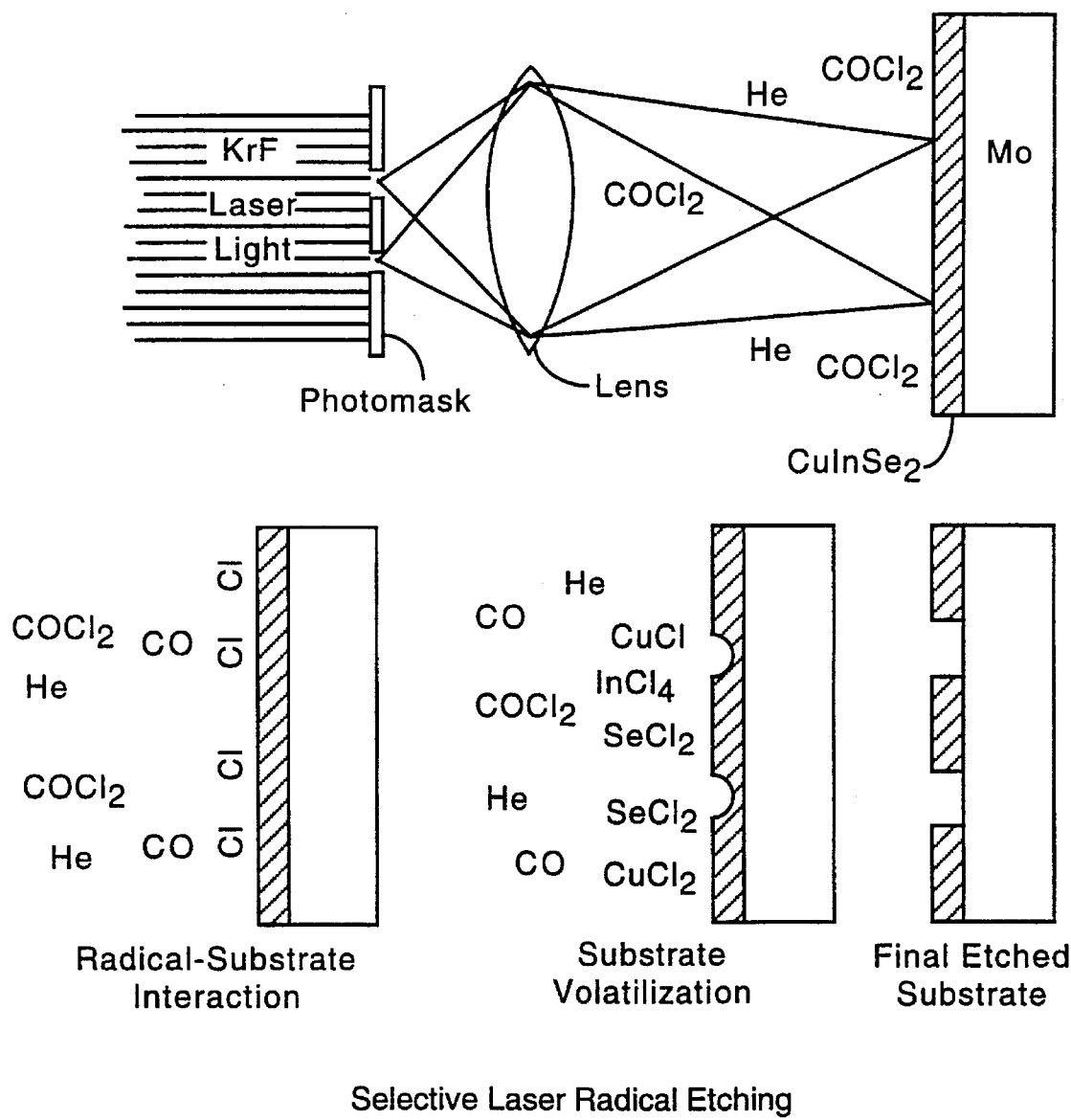
FIG. 1 illustrates a selective etching process of a film layer of $CuInSe_2$ on a molybdenum substrate using a carbonyl dichloride precursor gas and using a krypton fluoride laser to illuminate the film layer and to decompose the precursor gas.

Referring to FIG. 1, an ultraviolet krypton fluoride (KrF) laser is used as a photon energy beam source. Examples of other photon sources include lamps and synchrotron radiation sources, having wavelength outputs absorbed by the precursor gas. In the embodiment shown, the part to be patterned and etched is placed in a chamber containing a carbonyl dichloride ($COCl_2$) radical precursor compound in the gas phase and the part is exposed through a window, not shown, on the chamber. By the photon beam assisted etching process, a part is thus patterned and etched by placing it in the presence of an appropriate radical precursor compound and exposing it to the output of an appropriate photon source.

The output of a photon source is transmitted to the surface of the part to be patterned and etched through a suitable window on the chamber holding the part. The window may be made of solid materials or fluid (e.g. flowing gas or liquid) that are transmissive or partially transmissive at the wavelengths and fluences of light produced by the photon source. In some cases it may be possible to eliminate the window on the container holding the part. In such cases the surface of the part to be patterned and etched would be directly illuminated with photons from the photon source while also being immersed in a gaseous, liquid, solution, solid, or absorbed layer of the radical precursor compound.

Using a photon beam source, the desired exposure regions on the film's surface can be defined by projecting the photon beam onto the surface through a contact, proximity, or remote transmission photomask containing the desired etch pattern. An optical projection system can be employed to image the desired photon beam pattern onto the surface when a remote transmission mask is used. The desired exposure regions on the surface of the film can also be defined by writing with the photon beam. In this case, the photon beam is rastered across the surface and the intensity of the beam or dwell time, or both, are modified to provide the desired exposure dose in a given area.

Solar cell manufacturing processes involve many steps, such as the removal of compound semiconductor layers or a combination of compound semiconductor layers from the molybdenum (Mo). In a preferred embodiment for patterning and etching semiconductor films during the fabrication of $CuInSe_2$ solar cells, a chlorine atom etching process is used based on the KrF laser induced decomposition of carbonyl dichloride precursor gas to selectively and very rapidly remove either the $CuInSe_2$ layer from Mo, the $CdZnS/CuInSe_2$ combination layer from Mo, or the $ZnO/CdZnS/CuInSe_2$ combination layer from Mo.

The KrF laser 248 nm wavelength output overlaps the absorption band of the carbonyl dichloride resulting in decomposition of the carbonyl dichloride into carbon monoxide (CO) and atomic chlorine. The chlorine atoms bond to surface sites of one of the surface atoms, for example, a selenium (Se) atom of a $CuInSe_2$ layer. As the chlorine atoms create bonds with one constituent atom, e.g. $SeCl_2$, other molecular bonds at the surface break thereby atomizing all of the constituent surface atoms, for example indium, selenium and copper, of the molecular lattice. The atomized species at the surface form chlorine based molecular gases, $SeCl_2$, $InCl_4$, $CuCl$ and $CuCl_2$, all of which become volatile and desorb from the surface sites. The copper chlorides formed are the slowest to desorb of all of the constituent material of $CuInSe_2$ and limits the etching rate, but nonetheless is efficient. The laser photon energy may further lie within absorption bands of surface located copper chlorides enhancing the photoejection of etched products to further increase the etching rate. In this manner, surface material may be etched using a photon beam which decomposes the precursor gas into the radical constituents which bond to the surface material. The new molecules produced as the result of reactions of radical etchant species with surface material species are volatile and desorb from the surface sites.

In another embodiment for producing $CuIn_{(1-x)}Ga_{(x)}Se_2$ devices, this same process is used to remove the $CuIn_{(1-}$ $_{x)}Ga_{(x)}Se_2$, $CdZnS/CuIn_{(1-x)}Ga_{(x)}Se_2$, or $ZnO/CdZnS/CuIn_{(1-x)}Ga_{(x)}Se_2$ layers from Mo. The efficiency is enhanced using a KrF laser induced, chlorine atomic etching process for removing $CuIn_{(1-x)}Ga_{(x)}Se_2$, $CdZnS/CuIn_{(1-x)}Ga_{(x)}Se_{(2)}$, or $ZnO/CdZnS/CuIn_{(1-x)}Ga_{(x)}Se_2$ films from Mo. The semiconductor/Mo film layer combinations are placed in a gas cell or chamber and exposed at normal incidence in the presence of a $COCl_2$ and helium gas mixture with the 248 nm, pulsed output of a KrF excimer laser. Regions of the $CuIn_{(1-x)}Ga_{(x)}Se_2$, $CdZnS/CuIn_{(1-x)}Ga_{(x)}Se_2$, or $ZnO/CdZnS/CuIn_{(1-x)}Ga_{(x)}Se_2$ film surfaces where etching is desired are exposed to the necessary number of KrF laser pulses of the necessary fluence in the presence of a $COCl_2$ and helium gas mixture containing the appropriate partial pressure of $COCl_2$ gas to accomplish the etching process. The KrF laser is particularly preferred because it is an efficient laser at the desired wavelength for decomposing the $COCl_2$. Further it may tend to aid in the photoejection of the copper chlorides. The laser illuminates the surface so that radical precursor decomposition occurs in close proximity thereto.

Figure 2:
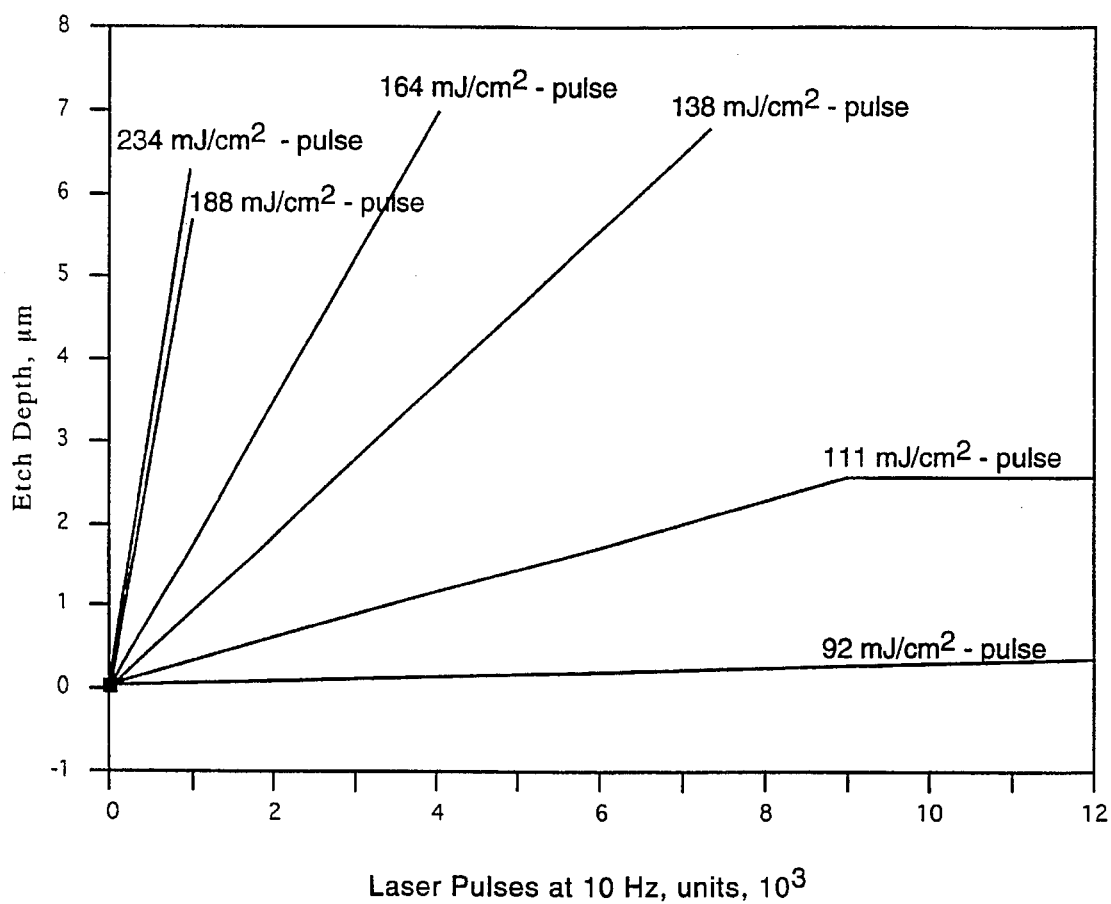
FIG. 2 is a graph showing the depth of etching produced in a $CdZnS/CuInSe_2$ bilayer film as a function of the number of incident laser pulses at different KrF laser fluences.
Figure 3:
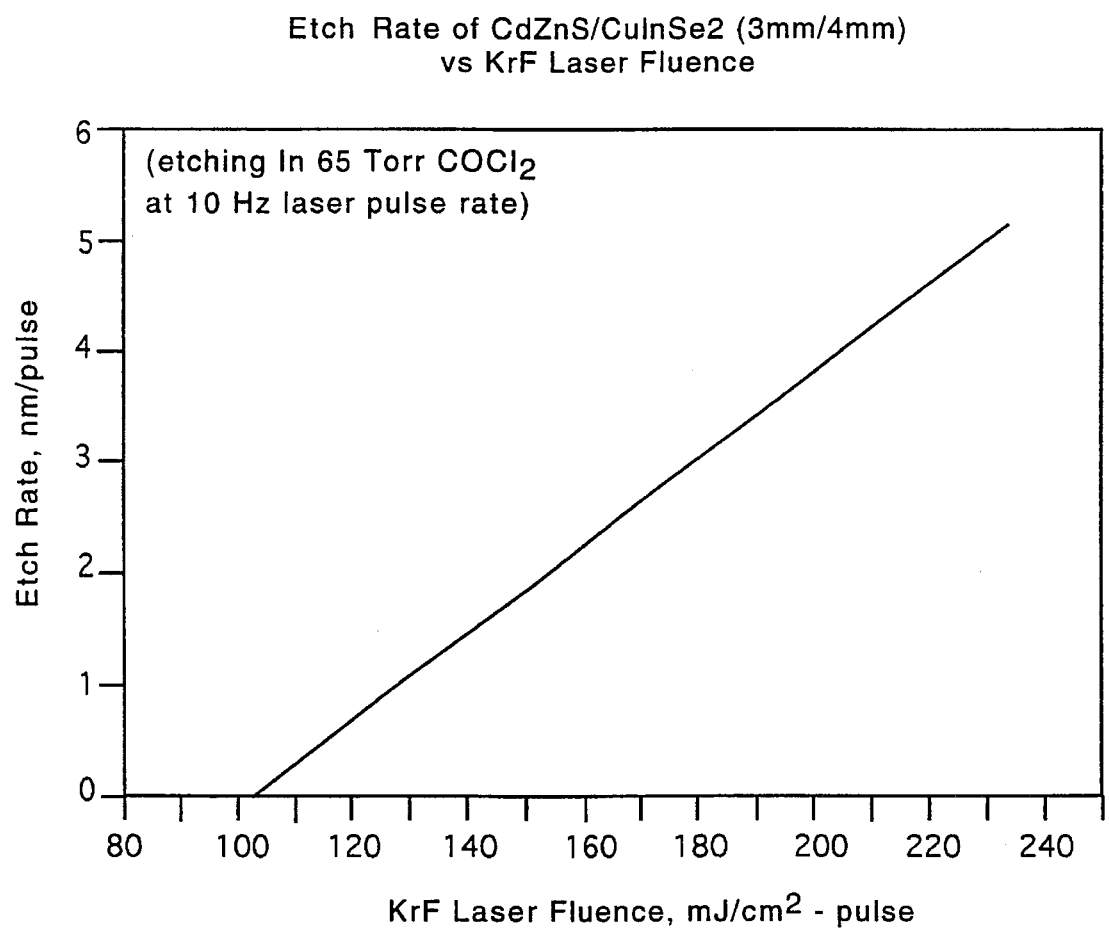
FIG. 3 is a graph showing the etch rate of a $CdZnS/CuInSe_2$ bilayer film as a function of KrF laser fluence.

FIG. 2 shows the laser etching results obtained at different KrF laser fluences on a sample containing the $CdZnS/CuInSe_2$ combination layer deposited on Mo. Etching in this case was carried out at a laser repetition rate of 10 Hz in the presence of a gas mixture containing 65 Torr of $COCl_2$ and 695 Torr of helium. The depth of etching produced in the exposure regions is plotted versus the total number of incident laser pulses. At fluences of 138 $mJ/cm^2$-pulse and higher, removal of both the CdZnS and $CuInSe_2$ layers is efficient. At fluences of 188 $mJ/cm^2$-pulse or higher, the entire 7–7.5-micron thick combination layer is removed under the conditions employed within 1500 laser pulses. The laser etch rates are given by the slopes of such plots. These etch rates are plotted in FIG. 3 versus laser fluence. The removal rates increase linearly with laser fluence once a threshold fluence of slightly more than 100 $mJ/cm^2$-pulse is exceeded. Removal of the combination layer would be best carried out in the 230–330 $mJ/cm^2$-pulse fluence regime since ablation damage to the underlying Mo layer may occur once laser fluences of 330–380 $mJ/cm^2$-pulse or greater are used. Highly selective removal of the $CdZnS/CuInSe_2$ layer from Mo is possible since Mo is etched with very poor efficiencies by this chlorine-atom etching process at KrF laser fluences of 330 $mJ/cm^2$-pulse and lower.

Studies were performed to determine the dependencies of the $CuInSe_2$, $CdZnS/CuInSe_2$, and $ZnO/CdZnS/CuIn_{(1-x)}Ga_{(x)}Se_2$ etch rates on laser fluence, $COCl_2$ pressure, and laser pulse repetition rate. These results, together with data on expected laser performance and operating costs, have been used to calculate expected processing costs and part fabrication rates for these laser processes. These processing cost and part fabrication rate calculations indicate that the KrF laser-assisted, chlorine-atom etching process will allow the lower-cost and higher-throughput fabrication of $CuInSe_2$ and $CuIn_{(1-x)}Ga_{(x)}Se_2$ cells, and tandem-cell structures in which these cells are used, than is presently possible using conventional photolithographic processing methods.

The dry etching process is also applicable to the removal of silicon from metal electrode layers. The fabrication of a-Si solar cells requires the ability to pattern and selectively remove the a-Si semiconductor layer from an underlying metal electrode layer. The atomic chlorine etching process developed, based on the KrF laser-induced decomposition of $COCl_2$, will be useful for this patterning and selective removal process, for example, when the a-Si layer has been deposited on Mo. This is possible since Si can form volatile chlorides and can be efficiently etched by this process, while Mo is etched with very poor efficiency by this process.

The dry etching process is also applicable to the removal of metal electrode layers from glass. The removal of Cu and Al metal electrode layers from glass is typically required during the fabrication of $CuInSe_2$, $CuIn_{(1-x)}Ga_{(x)}Se_2$, or a-Si solar cells. The atomic chlorine generation process, based on the KrF laser induced decomposition of $COCl_2$, can etch Cu and Al with very high efficiencies. Because this process etches glass ($SiO_2$) with poor efficiency, it is well-suited for rapidly and selectively removing Cu or Al from glass. These laser-assisted atomic chlorine etching processes can thus be used for patterning and selectively removing typical metal film layers from glass substrates during the fabrication of $CuInSe_2$, $CuIn_{(1-x)}Ga_{(x)}Se_2$, a-Si, GaAs or GaAlAs solar cells. The process is also well-suited for patterning and selectively removing Cu, Al, or Cu/Al alloy layers from $SiO_2$ (or other dielectric materials not efficiently etched by chlorine atoms) during the fabrication of integrated circuit devices or for forming reliable, electromigration-resistant electrical interconnects between various types of electronic devices and energy storage devices (e.g. solar cell and microbattery arrays).

The atomic chlorine generation process, based upon the KrF laser induced decomposition of $COCl_2$, can also efficiently etch GaAs and $Ga_{(1-x)}Al_{(x)}As$. The process thus could be readily applied to the patterning and etching of these semiconductor materials during the production of etch mesas around the perimeters of GaAs and $Ga_{(1-x)}Al_{(x)}As$ solar cells, or during the manufacture of electronic devices comprised of GaAs or $Ga_{(1-x)}Al_{(x)}As$.

The previously described atomic chlorine etching process would not be useful for selectively removing a-Si from Cu or Al electrode layers, since this process etches both of these metals with high efficiency.

A single commercial, 100-W KrF laser can be used, for example, with the atomic chlorine etching process for the low-cost and high-throughput patterning and etching of $CdZnS/CuInSe_2$ over Mo parts used in $CuInSe_2$ solar cells. The laser process would allow, for example, the cost-effective production of four 16 inch long etch lines of 175 microns width through a 7 micron thick $CdZnS/CuInSe_2$ combination film layer in each part. This process is also capable of efficiently etching $CuIn_{(1-x)}Ga_{(x)}Se_2$. Thus, similar desirable fabrication rates and costs will be possible by the laser process for producing the $CdZnS/CuIn_{(1-x)}Ga_{(x)}Se_2$ over Mo parts used in $CuIn_{(1-x)}Ga_{(x)}Se_2$ solar cells. Laser-generated, atomic chlorine etching process will have a highly favorable impact on lowering the fabrication costs of $CuInSe_2$ and $CuIn_{(1-x)}Ga_{(x)}Se_2$ solar cells.

The maskless, laser etching technique can pattern film layers directly without the resist patterning steps and the acid, reactive solution, or plasma etching steps required in the conventional photolithographic methods now used to fabricate solar cells. The disclosed laser etching processes will thus replace the most time consuming, yield reducing, and costly steps used in the fabrication of solar cells. The laser etching method will allow the lower-cost, higher-throughput fabrication of various types of solar cells than is currently possible using conventional photolithography. These include, but are not limited to, solar cells having $CuInSe_2$, $CuIn_{(1-x)}Ga_{(x)}Se_2$, a-Si, GaAs, and $Ga_{(1-x)}Al_xAs$ materials and various tandem-cell structures involving these cells.

Although the invention has been described in terms of a preferred embodiment, it will be obvious to those skilled in the art that alterations and modifications may be made without departing from the invention. For example, it is obvious that conditions can be readily modified to suit the circumstances. Laser modifications include but are not limited to wavelength(s), fluence(s), pulse length(s), and repetition rate(s). Radical precursor modifications include but are not limited to precursor(s), buffer gases, such as, $N_2$ or Ar and accompanying pressures. For most solar cell semiconductor materials, the radical species are preferably either chlorine, bromine, iodine, or trifluoromethyl radical that is, a heavy halogen or a halogen-substituted polyatomic radical. Fluorine efficiently etches Si or Ge but it does not efficiently etch most other solar cell semiconductor materials. Reaction chamber modifications include substrate temperature and total chamber pressure. The remainder portion of the decomposed radical precursor, for example, CO from $COCl_2$, must be substantially inert to the surface layer reacting with the radical species. Accordingly, it is intended that all such alterations and modifications be included within the spirit and scope of the invention as defined by the appended claims. Also, the invention can be practiced to produce a wide variety of solar cells (miniature, micro- or nano-scale) fabricated separately or in conjunction with electrical storage devices (e.g. microbatteries) or optical or mechanical or electronic devices.

We claim:

1. A dry etching process for the removal of surface layer material on a substrate of a semiconductor device, said process comprising the steps of exposing the semiconductor device to a carbonyl dichloride radical precursor gas including an inert buffer gas, and illuminating with a krypton fluoride excimer laser the precursor gas in proximity to said surface layer, said krypton fluoride laser having a wavelength within an absorption band of said carbonyl dichloride to decompose said carbonyl dichloride into inert carbon monoxide and atomic chlorine the latter of which bonds to atoms of said surface layer material where illuminated by said krypton fluoride laser to desorb said atoms from said semiconductor device.

2. The method of claim 1 wherein said inert buffer gas is helium.

3. The method of claim 1 wherein said surface layer material comprises copper.

4. The method of claim 1 wherein said surface layer material comprises aluminum.

5. The method of claim 1 wherein said surface layer material comprises $Ga_{(x)}Al_{(1-x)}A$, where x is a value between zero and one.

6. The method of claim 1 wherein said surface layer material comprises $CuIn_{(x)}Ga_{(1-x)}Se_2$, where x is a value between zero and one.

7. The method of claim 1 wherein said surface layer material comprises CdZnS.

8. The method of claim 1 wherein said surface layer material comprises ZnO.

9. The method of claim 1 wherein said surface layer material comprises amorphous silicon.

10. The method of claim 1 wherein said surface layer material is a combination of a CdZnS layer and a $CuInSe_2$ layer and said substrate is Mo.

11. The method of claim 1 wherein said surface layer material is a combination of a ZnO layer, a CdZnS layer and a $CuInSe_2$ layer and said substrate is Mo.

12. A dry etching process for the patterning and etch removal of surface layer material on a substrate of a semiconductor device, said process comprising the steps of, exposing said surface layer material to a precursor gas comprising a radical precursor compound having an absorption band for exciting said radical precursor compound to decompose said radical precursor compound into a halogen radical comprising a halogen constituent and into a remainder, said remainder is inert to said surface layer material, said halogen radical having a weight greater than atomic fluorine, and illuminating said surface layer material with a photon beam to illuminate said radical precursor compound in proximity to said surface layer material, said photon beam having photon energy within said absorption band of said radical precursor compound decomposing said radical precursor compound into said halogen radical and said remainder, said halogen radical bonding to atoms of said surface layer material, said bonding and said illuminating said surface layer material desorbing said atoms from said surface layer material for patterning and selectively etching said surface layer material.

13. A dry etching process for the removal of surface layer material on a substrate of a semiconductor device, said process comprising the steps of, exposing said surface layer material to a precursor gas comprising a carbonyl dichloride radical precursor compound having an absorption band for exciting said radical precursor compound to decompose said radical precursor compound into an atomic chlorine radical and into a remainder, said remainder is inert to said surface layer material, said atomic chlorine radical has an atomic weight greater than atomic fluorine, generating a photon beam at 248 nm from a krypton fluoride excimer laser, and illuminating said surface layer material with said photon beam to illuminate said radical precursor compound in proximity to said surface layer material, said photon having photon energy within said absorption band of said radical precursor compound decomposing said radical precursor compound into said halogen radical and said remainder, said halogen radical bonding to atoms of said surface material, said bonding and said illuminating said surface material desorbing said atoms from said surface layer material.

14. The method of claim 12 wherein said surface layer material comprises a topmost layer of a compound of semiconductor materials of groups III–V.

15. The method of claim 12 wherean said surface layer material comprises a topmost layer of a compound of semiconductor materials of groups II–VI.

16. The method of claim 12 wherein said surface layer material comprises a topmost layer of a semiconductor material of group IV.

17. The method of claim 12 wherein said surface layer material comprises a topmost layer of semiconductor materials of groups II–VI and I–III–$VI_2$ alloys.

* * * * *